United States Patent
Yoshizumi et al.

(10) Patent No.: US 9,548,197 B2
(45) Date of Patent: Jan. 17, 2017

(54) SUBSTRATE TREATMENT METHOD AND SUBSTRATE TREATMENT APPARATUS

(71) Applicant: DAINIPPON SCREEN MFG. CO., LTD., Kyoto (JP)

(72) Inventors: Asuka Yoshizumi, Kyoto (JP); Ayumi Higuchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 18 days.

(21) Appl. No.: 14/492,692

(22) Filed: Sep. 22, 2014

(65) Prior Publication Data

US 2015/0083167 A1 Mar. 26, 2015

(30) Foreign Application Priority Data

Sep. 26, 2013 (JP) .................. 2013-200424
Aug. 22, 2014 (JP) .................. 2014-169334

(51) Int. Cl.
| | | |
|---|---|---|
| B08B 3/04 | (2006.01) | |
| H01L 21/02 | (2006.01) | |
| H01L 21/67 | (2006.01) | |
| B08B 3/00 | (2006.01) | |
| B08B 3/02 | (2006.01) | |

(52) U.S. Cl.
CPC ... *H01L 21/02052* (2013.01); *H01L 21/67028* (2013.01); *H01L 21/67051* (2013.01); *B08B 3/00* (2013.01); *B08B 3/02* (2013.01); *B08B 3/022* (2013.01); *B08B 3/024* (2013.01); *B08B 3/04* (2013.01)

(58) Field of Classification Search
CPC ............... B08B 3/00; B08B 3/02; B08B 3/04; B08B 3/022; B08B 3/024; H01L 21/02052; H01L 21/67028; H01L 21/67051

See application file for complete search history.

(56) References Cited

U.S. PATENT DOCUMENTS

| | | | | |
|---|---|---|---|---|
| 2001/0016231 A1* | 8/2001 | Bower | ................... | B05D 1/305 |
| | | | | 427/420 |
| 2006/0099339 A1* | 5/2006 | Hashizume | ....... | H01L 21/67051 |
| | | | | 427/240 |
| 2007/0137677 A1 | 6/2007 | Nanba | ............................ | 134/33 |
| 2008/0052947 A1* | 3/2008 | Miya | ................. | H01L 21/67028 |
| | | | | 34/317 |

(Continued)

FOREIGN PATENT DOCUMENTS

| | | |
|---|---|---|
| JP | 2007-173308 | 7/2007 |
| JP | 2009-212408 | 9/2009 |
| JP | 2009-295910 | 12/2009 |

*Primary Examiner* — Bibi Carrillo
(74) *Attorney, Agent, or Firm* — Ostrolenk Faber LLP

(57) ABSTRACT

A substrate treatment method is provided, which includes a rinsing step of supplying a rinse liquid to a front surface of a rotating substrate after a chemical liquid step. The rinsing step includes a higher-speed rinsing step and a deceleration rinsing step to be performed after the higher-speed rinsing step. The deceleration rinsing step includes a liquid puddling step of reducing the rotation speed of the substrate within a rotation speed range lower than a rotation speed employed in the higher-speed rinsing step and supplying the rinse liquid to the front surface of the substrate at a flow rate higher than a maximum supply flow rate employed in the higher-speed rinsing step, whereby a puddle-like rinse liquid film is formed on the front surface of the substrate.

9 Claims, 10 Drawing Sheets

(56) References Cited

U.S. PATENT DOCUMENTS

| | | | |
|---|---|---|---|
| 2009/0032067 A1* | 2/2009 | Kojimaru | H01L 21/67034 134/26 |
| 2010/0101497 A1* | 4/2010 | Izuta | H01L 21/67051 118/730 |
| 2011/0315169 A1 | 12/2011 | Minami et al. | 134/30 |
| 2012/0074101 A1* | 3/2012 | Nakamura | H01L 21/67051 216/83 |
| 2013/0333722 A1* | 12/2013 | Tanaka | B08B 3/10 134/1 |
| 2014/0093644 A1* | 4/2014 | Fujii | B05D 1/005 427/240 |
| 2014/0352738 A1* | 12/2014 | Burkman | H01L 21/67051 134/33 |

* cited by examiner

FIG. 6

| DECELERATION PERIOD (sec) | 2L/min | VISUAL OBSERVATION | OBSERVATION RESULTS |
|---|---|---|---|
| 1s | ○ | OK | |
| 5s | × | FRONT SURFACE PERIPHERAL PORTION WAS PARTLY EXPOSED | |
| 10s | × | FRONT SURFACE PERIPHERAL PORTION IS EXPOSED, AND DIW LIQUID FILM PORTIONS RADIALLY LINEARLY EXTENDED FROM CENTER PORTION | |

FIG. 7

| DECELERATION PERIOD (sec) | 2L/min | 2.8L/min | 4L/min | VISUAL OBSERVATION | | |
|---|---|---|---|---|---|---|
| 1s | × | × | × | FRONT SURFACE PERIPHERAL PORTION IS EXPOSED, AND DIW LIQUID FILM PORTIONS RADIALLY LINEARLY EXTENDED FROM CENTER PORTION | | |
| 5s | × | × | × | | | |
| 10s | × | × | × | | | |
| 15s | × | × | × | | | |
| 18s | × | × | ○ | 2L/min, 2.8L/min | | 4L/min |
| 20s | × | × | ○ | FRONT SURFACE PERIPHERAL PORTION IS EXPOSED, AND DIW LIQUID FILM PORTIONS RADIALLY LINEARLY EXTENDED FROM CENTER PORTION | | OK |

SUBSTRATE TREATMENT METHOD AND SUBSTRATE TREATMENT APPARATUS

BACKGROUND OF THE INVENTION

1. Field of the Invention

The present invention relates to a substrate treatment method and a substrate treatment apparatus. Exemplary substrates to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

2. Description of Related Art

In production processes for semiconductor devices and liquid crystal display devices, a substrate treatment apparatus of a single substrate treatment type adapted to treat a single substrate at a time is used, which includes a spin chuck which horizontally holds a substrate and rotates the substrate, and a nozzle which spouts a treatment liquid toward a center portion of a front surface of the substrate being rotated by the spin chuck.

In a substrate treatment to be performed by the substrate treatment apparatus, a chemical liquid step of supplying a chemical liquid to the front surface of the rotating substrate, and a rinsing step of supplying a rinse liquid to the front surface of the rotating substrate are sequentially performed. Thereafter, isopropyl alcohol (IPA liquid) is supplied to the front surface of the substrate. The rotation speed of the substrate is zero or low when the IPA liquid is supplied. Since no centrifugal force or a smaller centrifugal force acts on the IPA liquid, the IPA liquid is retained on the front surface of the substrate to form a liquid film (this state is hereinafter referred to "puddle-like state"). After the rinse liquid is replaced with the IPA liquid on the front surface of the substrate, the rotation speed of the substrate is increased to spin off the IPA liquid film from the front surface of the substrate to dry the substrate.

JP2009-295910A and JP2009-212408A propose a method in which the puddle-like liquid film of the rinse liquid is retained on the front surface of the substrate (puddle rinsing step) before the IPA liquid film is retained on the front surface of the substrate after the rinsing step in this process sequence. According to these patent documents, the rinsing step is performed with the substrate being rotated at a predetermined liquid treatment rotation speed, and then the rotation speed of the substrate is reduced from the liquid treatment rotation speed to a lower speed. At this time, a smaller centrifugal force acts on the rinse liquid supplied to the substrate. Therefore, the rinse liquid stagnates on the front surface of the substrate, so that the puddle-like rinse liquid film is retained on the entire front surface of the substrate.

SUMMARY OF THE INVENTION

Then, the rinse liquid of the rinse liquid film is replaced with the IPA liquid, whereby a puddle-like IPA liquid film is retained on the entire front surface of the substrate. The IPA liquid film is formed over the rinse liquid film. As a result, the formation of the IPA liquid film can be easily achieved. In addition, the IPA liquid can be saved.

In the method according to the aforementioned patent documents, however, the rinse liquid film is not necessarily formed on the entire front surface of the substrate depending on the state of the front surface of the substrate, but at least a part of the front surface is liable to be exposed from the rinse liquid film. It is therefore an object of the present invention to provide a substrate treatment method and a substrate treatment apparatus which ensure that the front surface of the substrate can be entirely covered with a puddle-like rinse liquid film irrespective of the state of the front surface of the substrate.

According to the present invention, there is provided a substrate treatment method, which includes a chemical liquid step of supplying a chemical liquid to a front surface of a rotating substrate to treat the front surface of the substrate with the chemical liquid; and a rinsing step of supplying a rinse liquid to the front surface of the rotating substrate after the chemical liquid step to rinse away the chemical liquid from the front surface of the substrate with the rinse liquid and form a liquid film of the rinse liquid; wherein the rinsing step includes a higher-speed rinsing step and a deceleration rinsing step to be performed after the higher-speed rinsing step; wherein the deceleration rinsing step includes a liquid puddling step of reducing the rotation speed of the substrate within a rotation speed range lower than a rotation speed employed in the higher-speed rinsing step and supplying the rinse liquid to the front surface of the substrate at a supply flow rate higher than a maximum supply flow rate employed in the higher-speed rinsing step, whereby the rinse liquid film is formed in a puddle-like form on the front surface of the substrate.

In this method, in the deceleration rinsing step to be performed after the higher-speed rinsing step, the rinse liquid is supplied to the front surface of the substrate at the flow rate higher than the maximum supply flow rate employed in the higher-speed rinsing step. The rinse liquid supplied at the higher flow rate is forced out from a center portion of the substrate to a peripheral portion of the substrate to spread to the substrate peripheral portion. Thus, the puddle-like rinse liquid film can be reliably formed as covering the entire front surface of the substrate irrespective of the state of the front surface of the substrate.

In the liquid puddling step, the supply flow rate of the rinse liquid is preferably set to not lower than 4.0 (liters/min). In this case, the puddle-like rinse liquid film can be further reliably formed.

In the liquid puddling step, the rotation speed of the substrate is preferably reduced at a deceleration rate of not higher than 11.0 (rpm/sec). Where the deceleration rate for the deceleration of the rotation of the substrate is not higher than 11.0 (rpm/sec) in the liquid puddling step, a centrifugal force acting on the rinse liquid film is gradually reduced in the liquid puddling step. As a result, a force acting on the rinse liquid present on the substrate peripheral portion toward the substrate center portion can be kept reduced. Thus, the entire front surface of the substrate can be more reliably kept covered with the rinse liquid film in the deceleration rinsing step.

The deceleration rinsing step may further include a steep deceleration step of steeply reducing the rotation speed of the substrate at a higher deceleration rate than in the liquid puddling step after the higher-speed rinsing step.

In this method, the deceleration rinsing step of reducing the rotation speed of the substrate includes the step of steeply reducing the rotation speed of the substrate at the higher deceleration rate. This makes it possible to reduce the time required for reducing the rotation speed of the substrate to the rotation speed employed for the formation of the puddle-like liquid film.

The steep deceleration step is preferably performed for not longer than 1.0 sec. In the steep deceleration step, the centrifugal force acting on the rinse liquid film is steeply reduced. As a result, a greater force acts on the rinse liquid present on the substrate peripheral portion toward the substrate center portion. If the steep deceleration step is performed for not longer than 1.0 second, however, the rinse liquid is hardly moved from the substrate peripheral portion to the substrate center portion. This reliably prevents the front surface of the substrate from being exposed from the rinse liquid film in or after the steep deceleration step.

In the steep deceleration step, the rotation speed of the substrate is preferably reduced to not higher than 200 rpm. Since the rotation speed of the substrate is reduced to not higher than 200 rpm in the steep deceleration step, the substrate can be gradually decelerated at a lower deceleration rate in the subsequent liquid puddling step. This reduces the period of the overall deceleration rinsing step.

The supply flow rate of the rinse liquid to be supplied in the steep deceleration step is preferably not lower than 4.0 (liters/min). In this case, the rinse liquid supplied to the front surface of the substrate is forced out from the substrate center portion to the substrate peripheral portion to spread to the substrate peripheral portion. Thus, the entire front surface of the substrate can be more reliably kept covered with the rinse liquid film in the deceleration rinsing step.

According to one embodiment of the present invention, the supply flow rate of the rinse liquid to be supplied in the steep deceleration step may be set to the same flow rate as in the higher-speed rinsing step.

According to another embodiment of the present invention, the supply flow rate of the rinse liquid to be supplied in the steep deceleration step may be set to the same flow rate as in the liquid puddling step.

The method may further include a lower-surface-tension liquid replacing step of replacing the puddle-like rinse liquid film formed in the liquid puddling step with a lower-surface-tension liquid. In this case, the lower-surface-tension liquid replacing step can be performed on the substrate subjected to the rinsing step without exposing the front surface of the substrate.

According to the preset invention, there is also provided a substrate treatment apparatus, which includes: a substrate holding unit which holds a substrate; a substrate rotating unit which rotates the substrate held by the substrate holding unit; a chemical liquid supplying unit which supplies a chemical liquid to a front surface of the substrate being rotated by the substrate rotating unit; a rinse liquid supplying unit which supplies a rinse liquid to the front surface of the substrate being rotated by the substrate rotating unit; and a control unit which controls the substrate rotating unit, the chemical liquid supplying unit and the rinse liquid supplying unit to perform a chemical liquid step of supplying the chemical liquid to the front surface of the substrate while rotating the substrate at a predetermined rotation speed to treat the front surface of the substrate, and a rinsing step of supplying the rinse liquid to the front surface of the rotating substrate after the chemical liquid step to rinse away the chemical liquid from the front surface of the substrate and form a liquid film of the rinse liquid; wherein the rinsing step includes a higher-speed rinsing step and a deceleration rinsing step to be performed after the higher-speed rinsing step; wherein, in the deceleration rinsing step, the control unit performs a liquid puddling step of reducing the rotation speed of the substrate within a rotation speed range lower than a rotation speed employed in the higher-speed rinsing step and supplying the rinse liquid to the front surface of the substrate at a supply flow rate higher than a maximum supply flow rate employed in the higher-speed rinsing step, whereby the rinse liquid film is formed in a puddle-like form on the front surface of the substrate.

With this arrangement, in the deceleration rinsing step to be performed after the higher-speed rinsing step, the rinse liquid is supplied to the front surface of the substrate at the flow rate higher than the maximum supply flow rate employed in the higher-speed rinsing step. The rinse liquid supplied at the higher flow rate is forced out from a center portion to a peripheral portion of the substrate to spread to the substrate peripheral portion. Thus, the puddle-like rinse liquid film can be reliably formed on the front surface of the substrate as covering the entire front surface of the substrate irrespective of the state of the front surface of the substrate.

The foregoing and other objects, features and effects of the present invention will become more apparent from the following detailed description of the preferred embodiments with reference to the attached drawings.

BRIEF DESCRIPTION OF THE DRAWINGS

FIG. 6 is a diagram showing the test results of a first puddling test.

FIG. 7 is a diagram showing the test results of a second puddling test.

DETAILED DESCRIPTION OF PREFERRED EMBODIMENTS

Figure 1:
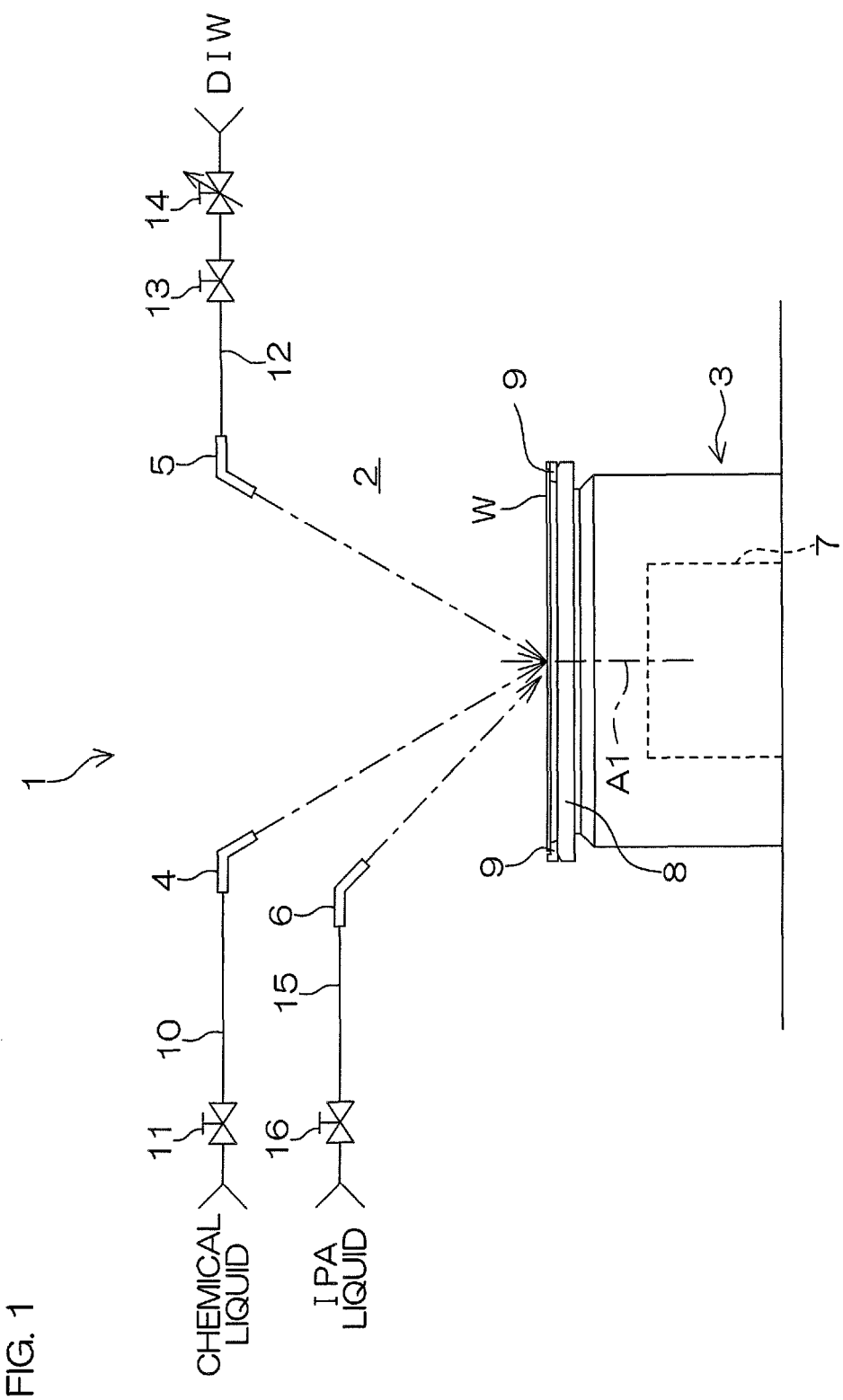
FIG. 1 is a diagram schematically showing the construction of a substrate treatment apparatus according to one embodiment of the present invention.

FIG. 1 is a diagram schematically showing the construction of a substrate treatment apparatus 1 according to one embodiment of the present invention.

The substrate treatment apparatus 1 is an apparatus of a single substrate treatment type adapted to clean a front surface (treatment surface) of a substrate W such as a semiconductor wafer.

The substrate treatment apparatus 1 includes a spin chuck (substrate holding unit) 3 which holds and rotates the substrate W, a chemical liquid nozzle 4 which supplies a chemical liquid to the front surface (upper surface) of the substrate W held by the spin chuck 3, a rinse liquid nozzle (rinse liquid supplying unit) 5 which supplies DIW (deionized water) as an exemplary rinse liquid to the front surface of the substrate W held by the spin chuck 3, and an organic solvent nozzle (organic solvent supplying unit) 6 which supplies an organic solvent such as isopropyl alcohol (IPA liquid) as an exemplary lower-surface-tension liquid. These components are provided in a treatment chamber 2 defined by a partition wall (not shown).

The spin chuck 3 is, for example, of a clamping type. More specifically, the spin chuck 3 includes a spin motor (substrate rotating unit) 7, a spin shaft (not shown) unitary with a drive shaft of the spin motor 7, a disk-shaped spin base 8 generally horizontally attached to an upper end of the spin shaft, and a plurality of clamping members 9 disposed in equidistantly spaced positions on a peripheral portion of the spin base 8. The clamping members 9 hold the substrate W in a generally horizontal attitude. When the spin motor 7 is driven in this state, the spin base 8 is rotated about a predetermined rotation axis (vertical axis) A1 by a driving force of the spin motor 7, whereby the substrate W is rotated about the rotation axis A1 together with the spin base 8 in the generally horizontal attitude.

The spin chuck 3 is not limited to the clamping type, but may be, for example, of a vacuum suction type, which sucks a back surface (lower surface) of the substrate W by vacuum to horizontally hold the substrate W and, in this state, is rotated about the rotation axis A1 to rotate the substrate W thus held.

The chemical liquid nozzle 4 is, for example, a straight nozzle which spouts the chemical liquid in the form of a continuous stream, and is fixedly disposed above the spin chuck 3 with its spout directed toward around the rotation center of the upper surface of the substrate W. The chemical liquid nozzle 4 is connected to a chemical liquid supply line 10 to which the chemical liquid is supplied from a chemical liquid source. A chemical liquid valve 11 which switches on and off the supply of the chemical liquid from the chemical liquid nozzle 4 is provided in the chemical liquid supply line 10. Examples of the chemical liquid include dilute hydrofluoric acid (DHF), concentrated hydrofluoric acid (concHF), hydrofluoric/nitric acid (liquid mixture of hydrofluoric acid and nitric acid ($HNO_3$) and an ammonium fluoride solution.

The rinse liquid nozzle 5 is, for example, a straight nozzle which spouts the DIW in the form of a continuous stream, and is fixedly disposed above the spin chuck 3 with its spout directed toward around the rotation center of the upper surface of the substrate W. The rinse liquid nozzle 5 is connected to a rinse liquid supply line 12 to which the DIW is supplied from a DIW supply source. A rinse liquid valve (rinse liquid supplying unit) 13 which switches on and off the supply of the DIW from the rinse liquid nozzle 5 and a flow rate adjusting valve 14 which adjusts the opening degree of the rinse liquid supply line to adjust the flow rate of the DIW to be spouted from the rinse liquid nozzle 5 are provided in the rinse liquid supply line 12.

The organic solvent nozzle 6 is, for example, a straight nozzle which spouts the IPA liquid in the form of a continuous stream, and is fixedly disposed above the spin chuck 3 with its spout directed toward around the rotation center of the upper surface of the substrate W. The organic solvent nozzle 6 is connected to an organic solvent supply line 15 to which the IPA liquid is supplied from an IPA supply source. An organic solvent valve 16 which switches on and off the supply of the IPA liquid from the organic solvent nozzle 6 is provided in the organic solvent supply line 15.

The chemical liquid nozzle 4, the rinse liquid nozzle 5 and the organic solvent nozzle 6 are not necessarily required to be fixedly disposed with respect to the spin chuck 3, but may be each provided, for example, in the form of a so-called scan nozzle which is attached to an arm pivotal within a horizontal plane above the spin chuck 3 so as to scan a liquid applying position to which the chemical liquid or the like is applied on the upper surface of the substrate W by the pivoting of the arm.

Figure 2:
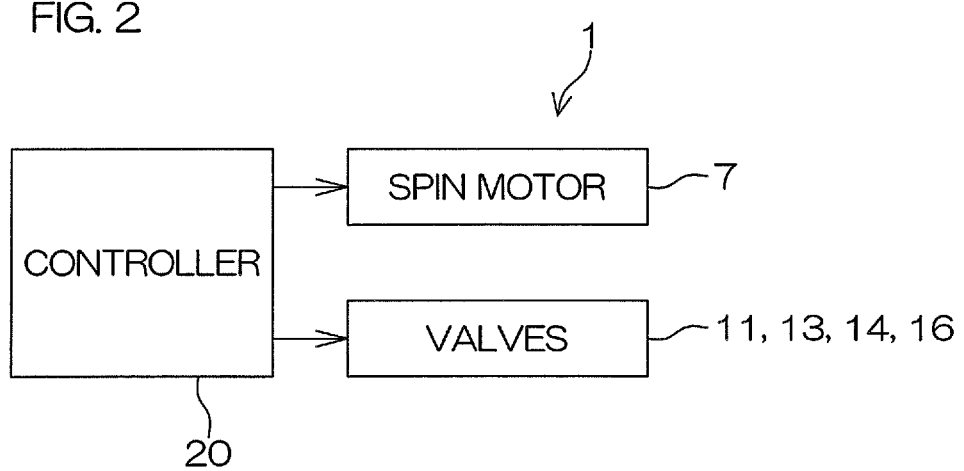
FIG. 2 is a block diagram showing the electrical construction of the substrate treatment apparatus shown in FIG. 1.

FIG. 2 is a block diagram showing the electrical construction of the substrate treatment apparatus 1.

The substrate treatment apparatus 1 includes a controller (control unit) 20 including a microcomputer. The controller 20 controls the operations of the spin motor 7 and other components according to predetermined programs. Further, the controller 20 controls the opening/closing operations of the chemical liquid valve 11, the rinse liquid valve 13 and the organic solvent valve 16 and the like, and controls the opening degree of the flow rate adjusting valve 14.

Figure 3:
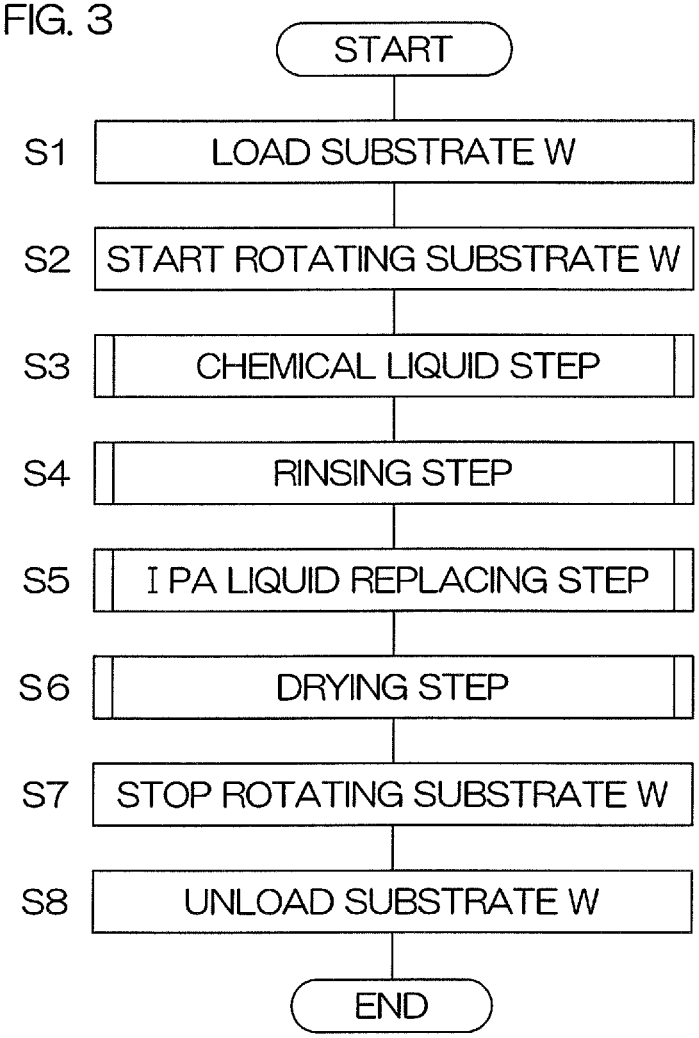
FIG. 3 is a process diagram showing an exemplary cleaning process to be performed by the substrate treatment apparatus shown in FIG. 1.
Figure 4:
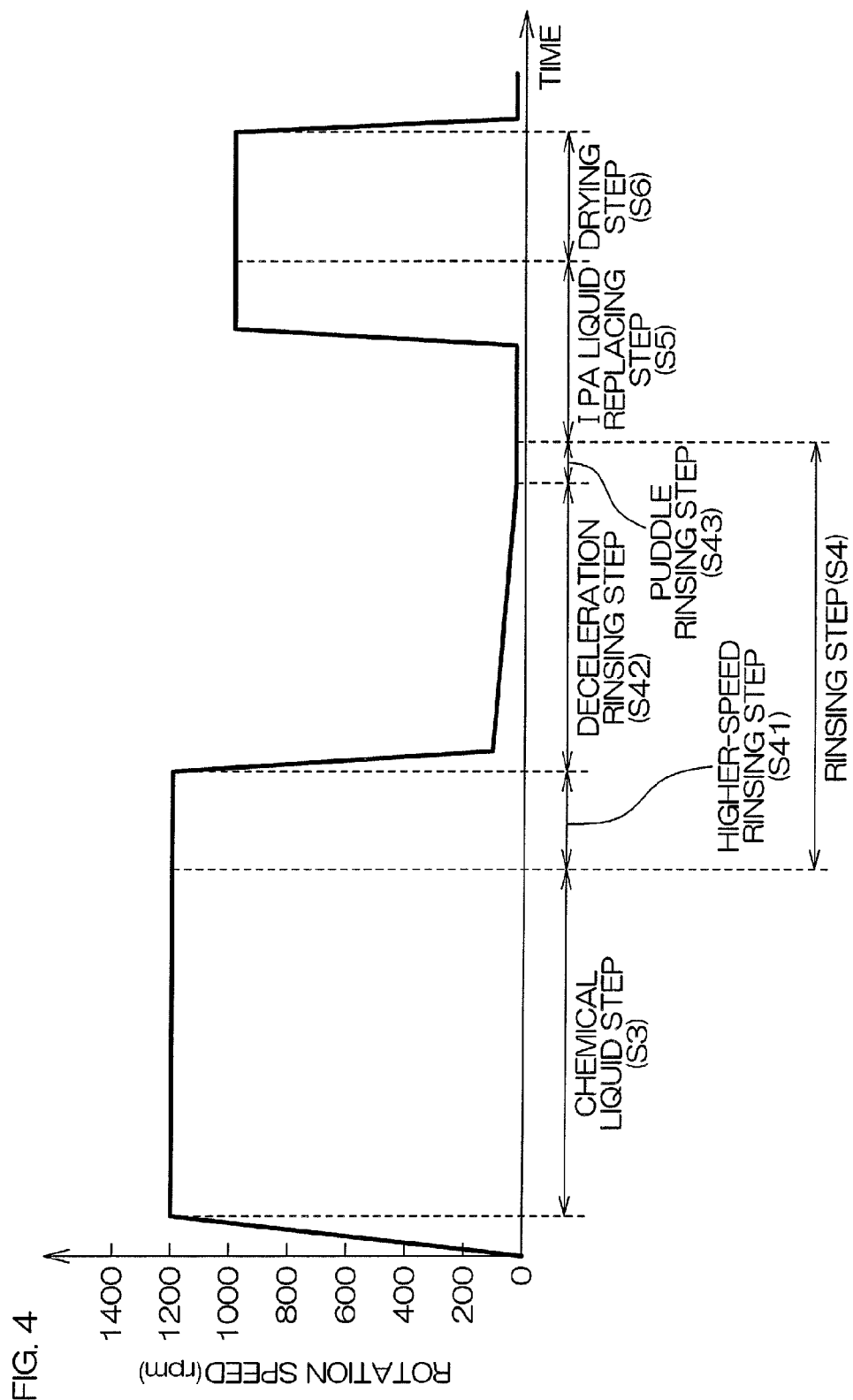
FIG. 4 is a diagram showing a change in the rotation speed of the substrate in process steps of the exemplary process shown in FIG. 3.
Figure 5:
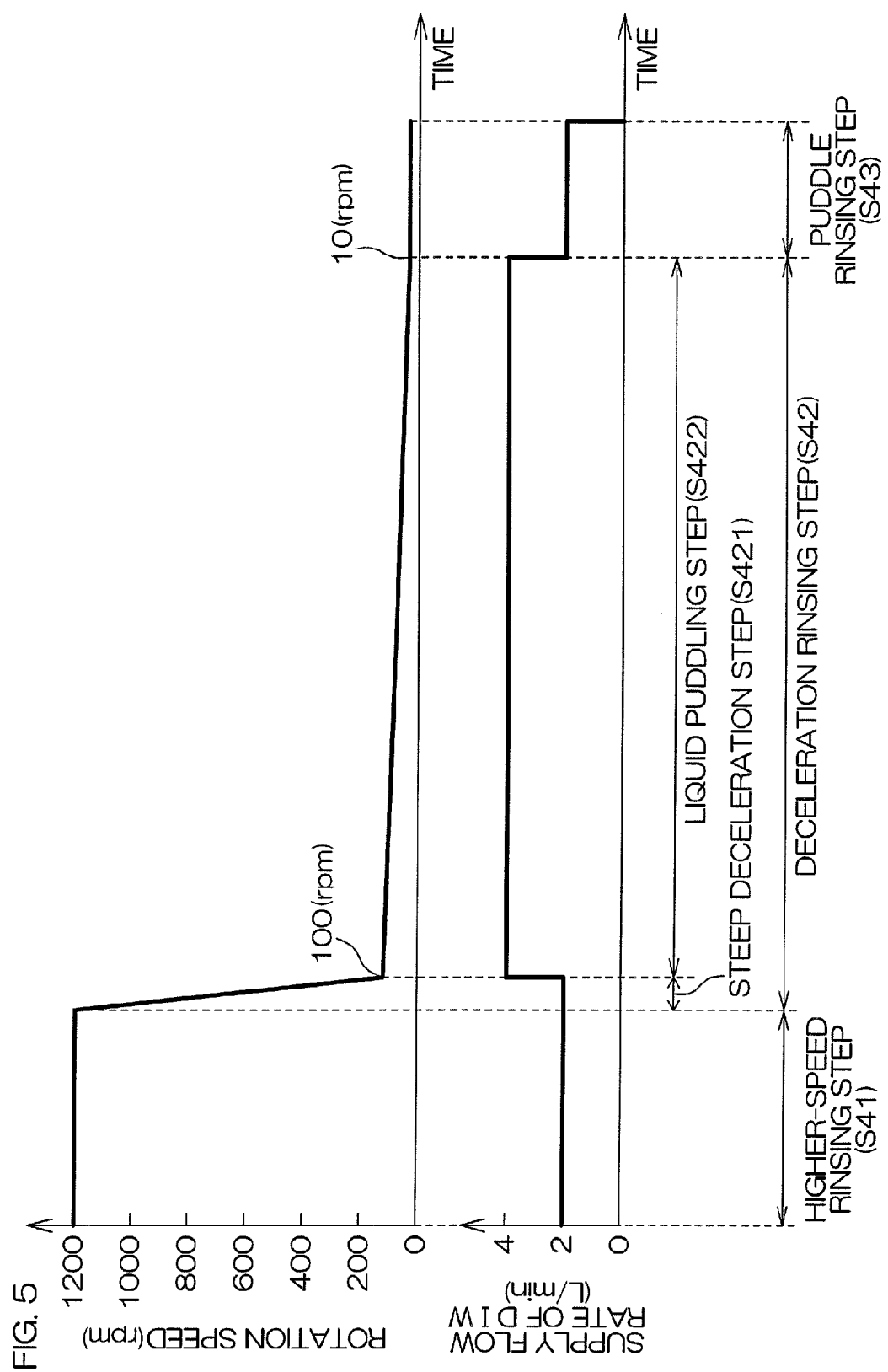
FIG. 5 is a diagram showing a change in the rotation speed of the substrate and the supply flow rate of DIW in the rinsing step of FIG. 4.

FIG. 3 is a process diagram showing an exemplary cleaning process to be performed by the substrate treatment apparatus 1. FIG. 4 is a diagram showing a change in the rotation speed of the substrate W in process steps of the exemplary process. FIG. 5 is a diagram showing a change in the rotation speed of the substrate W in the rinsing step. The exemplary cleaning process will hereinafter be described with reference to FIGS. 1 to 5.

In the cleaning process, a transport robot (not shown) is controlled to load an untreated substrate W into the treatment chamber 2 (see FIG. 1) (Step S1). An example of the substrate W is a silicon wafer having a front surface (device formation surface) formed with an oxide film. The substrate W may be a greater-size substrate (e.g., a round substrate having an outer diameter of 450 mm). The substrate W is transferred to the spin chuck 3 with its front surface facing up.

With the substrate W held by the spin chuck 3, the controller 20 controls the spin motor 7 to start rotating the substrate W (Step S2). The rotation speed of the substrate W is increased to a predetermined liquid treatment speed (in a range of 300 to 1200 rpm, e.g., 1200 rpm as shown in FIG. 4) and maintained at this chemical liquid treatment speed.

After the rotation speed of the substrate W reaches the chemical liquid treatment speed, the controller 20 starts a chemical liquid step (Step S3). More specifically, the controller 20 opens the chemical liquid valve 11 to spout the chemical liquid from the chemical liquid nozzle 4. At this time, the spouting flow rate of the chemical liquid to be spouted from the chemical liquid nozzle 4 is set, for example, to 2.0 (liters/min). The chemical liquid spouted from the chemical liquid nozzle 4 is supplied to a center portion of the upper surface of the substrate W, and receives a centrifugal force generated by the rotation of the substrate W to flow toward a peripheral edge of the substrate W on the upper surface of the substrate W. Thus, the chemical liquid is supplied to the entire upper surface of the substrate W to treat the substrate W with the chemical liquid.

After a lapse of a predetermined chemical liquid treatment period (e.g., about 180 seconds) from the start of the spouting of the chemical liquid, the controller 20 closes the chemical liquid valve 11 to stop spouting the chemical liquid from the chemical liquid nozzle 4. Where dilute hydrofluoric acid, concentrated hydrofluoric acid, hydrofluoric/nitric acid or an ammonium fluoride solution is used as the chemical liquid, the front surface of the substrate W treated with the chemical liquid is hydrophobic.

Subsequently, the controller 20 starts a rinsing step (Step S4). As shown in FIG. 4, the rinsing step (S4) is performed after the chemical liquid step (S3), and includes a higher-speed rinsing step (rotation rinsing step, Step S41) of supplying the rinse liquid to the upper surface of the substrate W while rotating the substrate W at the liquid treatment speed (rinsing speed), a deceleration rinsing step (S42) of reducing the rotation speed of the substrate W from the liquid treatment speed (e.g., 1200 rpm) to a puddling speed (0 to 20 rpm, e.g., 10 rpm as shown in FIG. 4), and a puddle-rinsing step (Step S43) of retaining a puddle-like liquid film of the DIW on the entire upper surface of the substrate W. As shown in FIG. 5, the deceleration rinsing step (S42) includes a steep deceleration step (Step S421) of steeply reducing the rotation speed of the substrate W at a higher deceleration rate, and a liquid puddling step (Step S422) of gradually reducing the rotation speed of the substrate W at a lower deceleration rate after the steep deceleration. The rinsing step (Step S4) will hereinafter be described specifically.

After the chemical liquid valve 11 is closed, the controller 20 opens the rinse liquid valve 13 to start spouting the DIW toward around the rotation center of the substrate W from the rinse liquid nozzle 5 while maintaining the rotation speed of the substrate W at the liquid treatment speed. Thus, the higher-speed rinsing step (Step S41) is started. At this time, the supply flow rate of the DIW to be supplied from the rinse liquid nozzle 5 is set, for example, to 2.0 (liters/min) by controlling the flow rate adjusting valve 14.

The DIW supplied to around the upper surface center portion of the substrate W receives the centrifugal force generated by the rotation of the substrate W to flow toward a peripheral portion of the substrate W on the upper surface of the substrate W, whereby the upper surface of the substrate W is entirely covered with a liquid film of the DIW. At this time, the supply flow rate of the DIW supplied from the rinse liquid nozzle 5 is relatively high, so that the chemical liquid adhering to the upper surface of the substrate W can be reliably rinsed away.

After a lapse of a predetermined higher-speed rinsing period (e.g., 4.5 seconds) from the start of the spouting of the DIW from the rinse liquid nozzle 5, the controller 20 starts the steep deceleration step (S421). More specifically, the controller 20 controls the spin motor 7 to steeply reduce the rotation speed of the substrate W from the liquid treatment speed (1200 rpm) to about 100 rpm while continuously spouting the DIW from the rinse liquid nozzle 5 at a flow rate of 2.0 (liters/min). The period (steep deceleration period to be described below) of the steep deceleration step (S421) is set, for example, to 1.0 second, and the deceleration rate for the steep deceleration step (S421) is, for example, about 1000 (rpm/min). The period of the steep deceleration step (S421) may be set to not longer than 1.0 second. The rotation speed of the substrate W after the steep deceleration step (S421) may be about 200 rpm.

In the steep deceleration step (S421), the deceleration of the rotation of the substrate W is steep, so that the centrifugal force acting on the DIW liquid film is steeply reduced. As a result, a greater force acts on the DIW present on the peripheral portion of the substrate W toward the center portion of the substrate W. However, the steep deceleration step (S421) is performed for only a short period of time (i.e., not longer than 1.0 second), so that the DIW is hardly moved from the peripheral portion of the substrate W to the center portion of the substrate W. As a result, the peripheral portion of the upper surface (front surface) of the substrate W is not exposed from the DIW liquid film during the steep deceleration of the substrate W. This makes it possible to reduce the rotation speed of the substrate W to about 100 rpm while continuously covering the entire front surface of the substrate W with the DIW.

After a lapse of the steep deceleration period (e.g., 1.0 second) from the start of the deceleration of the substrate W, the controller 20 starts the liquid puddling step (S422). In the liquid puddling step (S422), the rotation speed of the substrate W is reduced within a rotation speed range lower than the rotation speed (1200 rpm) employed in the higher-speed rinsing step (S41). That is, the rotation speed of the substrate W is gradually reduced at a predetermined lower deceleration rate (e.g., 4.5 (rpm/sec)) from the rotation speed (100 rpm) employed after the steep deceleration step (S421) to a puddling speed (about 0 to about 20 rpm), whereby the puddle-like DIW liquid film is formed on the front surface of the substrate W. More specifically, the controller 20 controls the flow rate adjusting valve 14 so that the spouting flow rate of the DIW to be spouted from the rinse liquid nozzle 5 is increased to 4.0 (liters/min). Further, the controller 20 controls the spin motor 7 so that the rotation speed of the substrate W is gradually reduced at the lower deceleration rate (e.g., 4.5 (rpm/sec)). The period (gradual deceleration period) of the liquid puddling step (S422) is set, for example, to 20 seconds, and the rotation speed of the substrate W is reduced from 100 rpm to 10 rpm in this period. The deceleration rate employed in the liquid puddling step (S422) is 4.5 (rpm/sec) byway of example, but may be any deceleration rate not higher than 11.0 (rpm/sec). The DIW supply flow rate employed in the liquid puddling step (S422) is 4.0 (liters/min) by way of example, but may be any supply flow rate not lower than 4.0 (liters/min).

In the liquid puddling step (S422), the flow rate of the DIW to be supplied to the substrate W is increased to 4.0 (liters/min) immediately after the completion of the steep deceleration step (S421). This reliably prevents the upper surface of the substrate W from being exposed from the DIW liquid film when the liquid puddling step (S422) is performed after the steep deceleration step (S421).

In the liquid puddling step (S422), the rotation of the substrate W is gradually decelerated at the lower deceleration rate, so that the centrifugal force acting on the DIW liquid film is gradually reduced. As a result, a reduced force acts on the DIW present on the peripheral portion of the substrate W toward the center portion of the substrate W. The liquid puddling step (S422) in which the DIW present on the peripheral portion of the substrate W receives the reduced force is performed subsequently to the steep deceleration step (S421) in which the DIW present on the peripheral portion receives the greater force acting toward the center portion of the substrate W. Therefore, the movement of the DIW liquid film toward the center portion of the substrate W, which is promoted in the steep deceleration step (S421), is suppressed in the liquid puddling step (S422).

In the liquid puddling step (S422), the flow rate (4.0 liters/min) of the DIW to be supplied to the substrate W is higher than the maximum supply flow rate (2.0 (liters/min)) employed in the higher-speed rinsing step (S41), so that the DIW supplied to the center portion of the substrate W is forced out from the center portion to the peripheral portion of the substrate W to reliably spread to the peripheral portion.

At the initial stage of the higher-speed rinsing step (S41), as described above, the DIW is supplied at a relatively high flow rate to reliably remove the chemical liquid from the front surface of the substrate W. In the liquid puddling step (S422), the DIW is supplied to the substrate W at a flow rate further higher than the maximum flow rate employed in the higher-speed rinsing step (S41). Therefore, the DIW liquid film can be retained on the entire front surface of the substrate W throughout the period of the liquid puddling step (S422).

Thus, the front surface of the substrate W is kept entirely covered with the DIW throughout the steep deceleration step (S421) and the liquid puddling step (S422) in the deceleration rinsing step (S42).

After the rotation speed of the substrate W is reduced to the puddling speed (about 0 to about 20 rpm), the controller 20 controls the spin motor 7 to maintain the rotation speed of the substrate W at the puddling speed. Thus, the puddle rinsing step (S43) is performed in which the puddle-like DIW liquid film is retained on the entire front surface of the substrate W.

After a lapse of a predetermined puddle rinsing period (e.g., 2.6 seconds) from a time at which the rotation speed of the substrate W is reduced to the puddling speed (about 0 to about 20 rpm), the controller 20 closes the rinse liquid valve 13 to stop spouting the DIW from the rinse liquid nozzle 5.

In turn, the controller 20 starts an IPA liquid replacing step (Step S5). More specifically, the controller 20 opens the organic solvent valve 16 to spout the IPA liquid toward around the rotation center of the substrate W from the organic solvent valve 6, while maintaining the rotation speed of the substrate W at the puddling speed. At this time, the spouting flow rate of the IPA liquid to be spouted from the organic solvent nozzle 6 is set, for example, to 0.1 (liter/min). Thus, the IPA liquid is supplied to the front surface of the substrate W, whereby the DIW of the DIW liquid film present on the front surface of the substrate W is sequentially replaced with the IPA liquid. As a result, a puddle-like IPA liquid film is retained on the upper surface of the substrate W as covering the entire front surface of the substrate W.

After a lapse of a predetermined IPA puddling period (e.g., about 10 seconds) from the start of the spouting of the IPA liquid, the controller 20 increases the rotation speed of the substrate W from the puddling speed to a higher rotation speed (e.g., about 1000 rpm) in a stepwise manner (e.g., at four stages (e.g., 10 rpm→50 rpm→75 rpm→100 rpm→1000 rpm)). After a lapse of a predetermined IPA treatment period (e.g., about 20 seconds) from the start of the spouting of the IPA liquid after the rotation speed of the substrate W reaches the higher rotation speed, the controller 20 closes the organic solvent valve 16 to stop spouting the IPA liquid from the organic solvent nozzle 6.

After the spouting of the IPA liquid is stopped, the controller 20 performs a drying step (Step S6). That is, the controller 20 maintains the rotation speed of the substrate W at 1000 rpm. Thus, the IPA liquid adhering to the substrate W is spun off to dry the substrate W.

After the drying step (S6) is performed for a predetermined drying period, the controller 20 controls the spin motor 7 to stop rotating the spin chuck 3 (to stop rotating the substrate W) (Step S7). Thus, the cleaning process for the single substrate W is completed. The treated substrate W is unloaded from the treatment chamber 2 by the transport robot (Step S8).

Next, puddling tests will be described. FIG. 6 is a diagram showing the test results of a first puddling test. FIG. 7 is a diagram showing the test results of a second puddling test. In the first and second puddling tests, the exemplary process shown in FIGS. 3 to 5 was performed with the use of the substrate treatment apparatus 1.

The first puddling test aims at determining optimum conditions for the steep deceleration step (S421). In the first puddling test, the higher-speed rinsing step (S41) was performed by supplying the DIW at a supply flow rate of 2.0 (liters/min) to the center portion of the substrate W to form the DIW liquid film on the front surface of the substrate W. Thereafter, the rotation speed of the substrate W was reduced from 1200 rpm to 100 rpm, while the DIW was supplied at a supply flow rate of 2.0 (liters/min) to the center portion of the substrate W. A silicon wafer (having an outer diameter of 450 mm) having a front surface formed with an oxide film was used as the substrate W, and dilute hydrofluoric acid was used as the chemical liquid. The steep deceleration step (S421) was performed for different periods, i.e., 1.0 seconds (1 s), 5.0 seconds (5 s) and 10.0 seconds (10 s), and the state of the DIW liquid film on the front surface of the substrate W was visually observed in the steep deceleration step (S421). The test results are shown in FIG. 6.

Where the period of the steep deceleration step (S421) (deceleration period) was 1.0 second, as shown in FIG. 6, the upper surface of the substrate W was kept entirely covered with the DIW liquid film during the steep deceleration.

Where the period of the steep deceleration step (S421) was 5.0 seconds, on the other hand, the upper surface of the substrate W except the peripheral portion was substantially entirely covered with the DIW liquid film but the peripheral portion of the upper surface (front surface) of the substrate W was partly exposed from the DIW liquid film. That is, the upper surface of the substrate W was not completely covered with the DIN.

Where the period of the steep deceleration step (S421) was 10.0 seconds, the DIW liquid film was retained on the center portion of the upper surface of the substrate W, and radially spread to the peripheral portion of the substrate W. Therefore, the upper surface (front surface) of the substrate W was partly exposed from the DIW liquid film. In other words, the DIW liquid film was configured such that DIW liquid film portions present on the peripheral portion of the substrate W extend radially linearly from a generally round DIW liquid film portion retained on the center portion of the substrate W (this state is herein referred to as "split liquid film"). In this case, needless to say, the upper surface of the substrate W was not completely covered with the DIW liquid film.

The second puddling test aims at determining optimum conditions for the liquid puddling step (S422). In the second puddling test, the higher-speed rinsing step (S41) was performed by supplying the DIW at a supply flow rate of 2.0 (liters/min) to the center portion of the substrate W to form the DIW liquid film on the front surface of the substrate W. Then, the steep deceleration step (S421) was performed to steeply reduce the rotation speed of the substrate W to 200 rpm. Thereafter, the rotation speed of the substrate W was reduced from 200 rpm to 10 rpm, while the DIW was supplied to the center portion of the substrate W. A silicon wafer (having an outer diameter of 450 mm) having a front surface formed with an oxide film was used as the substrate W, and a dilute hydrofluoric acid was used as the chemical liquid.

The liquid puddling step (S422) was performed for different periods, i.e., 1.0 second (1 s), 5.0 seconds (5 s), 10.0 seconds (10 s), 15.0 seconds (15 s), 18.0 seconds (18 s) and 20.0 seconds (20 s), and the DIW was supplied at different flow rates, i.e., 2.0 (liters/min), 2.8 (liters/min) and 4.0 (liters/min), to the substrate W. Then, the state of the DIW liquid film on the front surface of the substrate W was visually observed in the liquid puddling step (S422). The test results are shown in FIG. 7.

Where the supply flow rate of the DIW supplied to the substrate W was 2.0 (liters/min) or 2.8 (liters/min), as shown in FIG. 7, the upper surface of the substrate W was not entirely covered with the DIW liquid film irrespective of the period of the liquid puddling step (S422). Therefore, the DIW liquid film was split on the peripheral portion of the substrate W.

Where the supply flow rate of the DIW supplied to the substrate W was 4.0 (liters/min) and the period of the liquid puddling step (S422) was not shorter than 18.0 seconds, the upper surface of the substrate W was kept entirely covered with the DIW liquid film.

Where the supply flow rate of the DIW supplied to the substrate W was 4.0 (liters/min) and the period of the liquid puddling step (S422) was not longer than 15.0 seconds, on the other hand, the upper surface of the substrate W was not entirely covered with the DIW liquid film. Therefore, the DIW liquid film was split on the peripheral portion of the substrate W.

Where the supply flow rate of the DIW supplied to the substrate W in the liquid puddling step (S422) was substantially the same as the maximum supply flow rate employed in the higher-speed rinsing step (S41), i.e., 2.0 (liters/min), the DIW liquid film was split on the substrate W even with a relatively long deceleration period (e.g., 18 seconds). Where the supply flow rate of the DIW supplied to the substrate W in the liquid puddling step (S422) was 4.0 (liters/min) which was higher than the maximum supply flow rate (2.0 (liters/min) employed in the higher-speed rinsing step (S41), on the other hand, the DIW liquid film was prevented from being split on the substrate W.

According to this embodiment, as described above, the deceleration rinsing step (S42) includes the steep deceleration step (S421) and the liquid puddling step (S422) to be performed subsequently to the steep deceleration step (S421).

Since the deceleration rate of the rotation of the substrate W is higher in the steep deceleration step (S421), the centrifugal force acting on the DIW liquid film is steeply reduced. As a result, a greater force acts on the DIW present on the peripheral portion of the substrate W toward the center portion of the substrate W. However, the period of the steep deceleration step (S421) is set to a shorter period (i.e., 1.0 second or shorter), so that the DIW is hardly moved from the peripheral portion to the center portion of the substrate W. Thus, the peripheral portion of the upper surface (front surface) of the substrate W is prevented from being exposed from the DIW liquid film during the steep deceleration of the substrate W. This makes it possible to reduce the rotation speed of the substrate W to the puddling speed (10 rpm) while continuously covering the entire upper surface of the substrate W with the DIW liquid film.

In the liquid puddling step (S422), the deceleration rate of the rotation of the substrate W is lower, so that the centrifugal force acting on the DIW liquid film is gradually reduced. As a result, a force acting on the DIW present on the peripheral portion of the substrate W toward the substrate center portion is reduced. The liquid puddling step (S422) in which the DIW present on the peripheral portion of the substrate W receives a reduced force is performed subsequently to the steep deceleration step (S421) in which the DIW present on the peripheral portion of the substrate W receives the greater force acting toward the center portion of the substrate W. Therefore, the movement of the DIW liquid film toward the center portion of the substrate W, which is promoted in the steep deceleration step (S421), is suppressed in the liquid puddling step (S422).

In the liquid puddling step (S422), the flow rate of the DIW to be supplied to the substrate W is higher (4.0 (liters/min)) than the maximum supply flow rate (2.0 (liters/min)) employed in the higher-speed rinsing step (S41). Therefore, the DIW supplied to the center portion of the substrate W is forced out from the center portion to the peripheral portion of the substrate W. Thus, the DIW can reliably spread to the peripheral portion.

Even if the substrate W is a greater-size substrate having a hydrophobic front surface, therefore, the upper surface (front surface) of the substrate W is hardly exposed from the DIW liquid film, but entirely covered with the DIW liquid film throughout the deceleration rinsing step (S42). That is, the rotation speed of the substrate W can be reduced to the puddling speed, while the upper surface of the substrate W is kept entirely covered with the DIW liquid film. Therefore, the puddle-like DIW liquid film can be retained on the upper surface of the substrate W as covering the entire upper surface of the substrate W.

Even if the period of the deceleration rinsing step (S42) is set to a shorter period, the puddle-like DIW liquid film can be retained on the upper surface of the substrate W as covering the entire upper surface of the substrate W after the deceleration rinsing step (S42). In other words, even if the substrate W is a greater-size substrate having a hydrophobic front surface, the (puddle-like) DIW liquid film can be formed as covering the entire upper surface of the substrate W in a shorter period of time.

While the one embodiment of the present invention has thus been described, the present invention may be embodied in other ways.

In the embodiment described above, the supply flow rate of the DIW to be supplied to the substrate W is increased by changing the spouting flow rate of the DIW to be spouted from the rinse liquid nozzle 5 in the liquid puddling step (S422), but may be increased by spouting the DIW from another nozzle provided separately from the rinse liquid nozzle 5 in the liquid puddling step (S422).

Figure 8A:
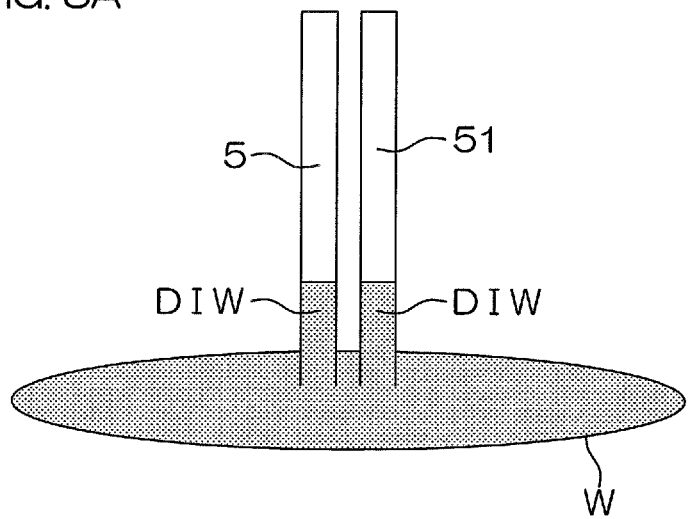
FIG. 8A is a diagram showing a first modification of the present invention.

In a modification of FIG. 8A, a nozzle 51 which supplies the DIW to the center portion of the substrate W is provided separately from the rinse liquid nozzle 5. The nozzle 51 is a straight nozzle which spouts the DIW as the rinse liquid in the form of a continuous stream, and is fixedly disposed above the spin chuck 3 (see FIG. 1) with its spout directed toward around the rotation center of the substrate W. The DIW is supplied to the nozzle 51 from the DIW supply source.

Upon the start of the liquid puddling step (S422) the spouting of the DIW from the nozzle 51 is started while the DIW is continuously spouted from the rinse liquid nozzle 5 at the same flow rate as the previous flow rate. Thus, the DIW is supplied to the center portion of the substrate W not only from the rinse liquid nozzle 5 but also from the nozzle 51 in the liquid puddling step (S422). Therefore, the supply flow rate of the DIW to be supplied to the substrate W is increased in the liquid puddling step (S422).

Figure 8B:
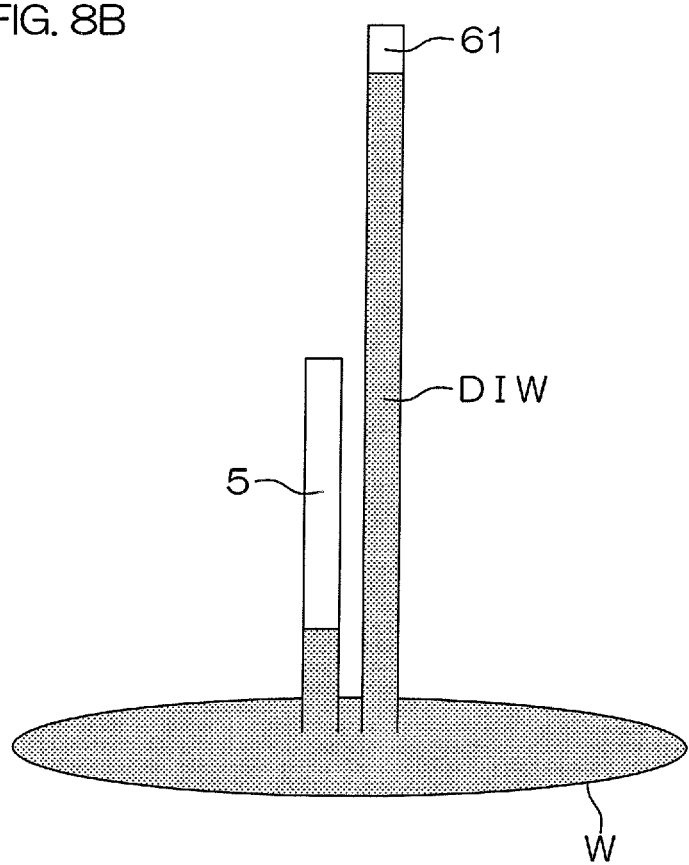
FIG. 8B is a diagram showing a second modification of the present invention.

In a modification of FIG. 8B, a ceiling nozzle 61 provided on a ceiling of the treatment chamber 2 (see FIG. 1) is used to supply the DIW to the upper surface of the substrate W in the liquid puddling step (S422). The ceiling nozzle 61 is originally adapted to spout the DIW as a cleaning liquid to an arm which pivotally supports a nozzle and to a shielding member which shields a space above the upper surface of the substrate W from the surrounding atmosphere. The ceiling nozzle 61 is, for example, a straight nozzle which spouts the DIW in the form of a continuous stream, and is fixedly disposed above the spin chuck 3 (see FIG. 1) with its spout directed toward around the rotation center of the substrate W. The DIW is supplied to the ceiling nozzle 61 from the DIW supply source.

Upon the start of the liquid puddling step (S422) the spouting of the DIW from the ceiling nozzle 61 is started while the DIW is continuously spouted from the rinse liquid nozzle 5 at the same flow rate as the previous flow rate. Thus, the DIW is supplied to the center portion of the substrate W not only from the rinse liquid nozzle 5 but also from the ceiling nozzle 61 in the liquid puddling step (S422). Therefore, the supply flow rate of the DIW to be supplied to the substrate W is increased in the liquid puddling step (S422).

In the modifications of FIGS. 8A and 8B, the DIW is supplied as the rinse liquid only to the center portion of the substrate W by way of example, but may be supplied not only to the center portion of the substrate W but also to the peripheral portion of the substrate W. Modifications associated with this arrangement are shown in FIGS. 9A to 9C.

Figure 9A:
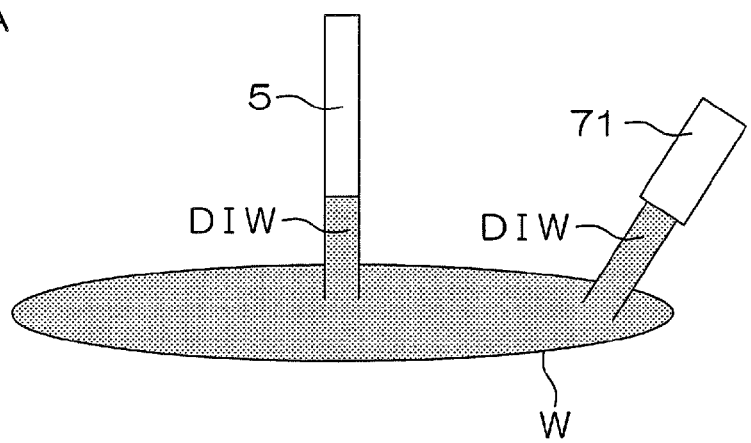
FIG. 9A is a diagram showing a third modification of the present invention.

The modification of FIG. 9A differs from the modification of FIG. 8A in that a nozzle 71 which supplies the DIW to the peripheral portion of the substrate W is provided. The nozzle 71 is a straight nozzle which spouts the DIW as the rinse liquid in the form of a continuous stream, and is fixedly disposed above the spin chuck 3 (see FIG. 1) with its spout directed toward the peripheral portion of the substrate W. The DIW is supplied to the nozzle 71 from the DIW supply source. In the liquid puddling step (S422), the DIW is not only supplied to the center portion of the substrate W from the rinse liquid nozzle 5, but also supplied to the peripheral portion of the substrate W from the nozzle 71. Therefore, the supply flow rate of the DIW to be supplied to the substrate W is increased in the liquid puddling step (S422).

Figure 9B:
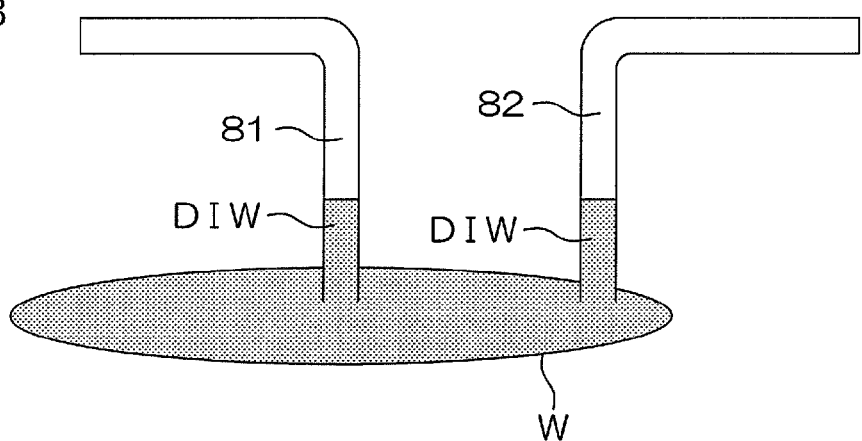
FIG. 9B is a diagram showing a fourth modification of the present invention.
Figure 9C:
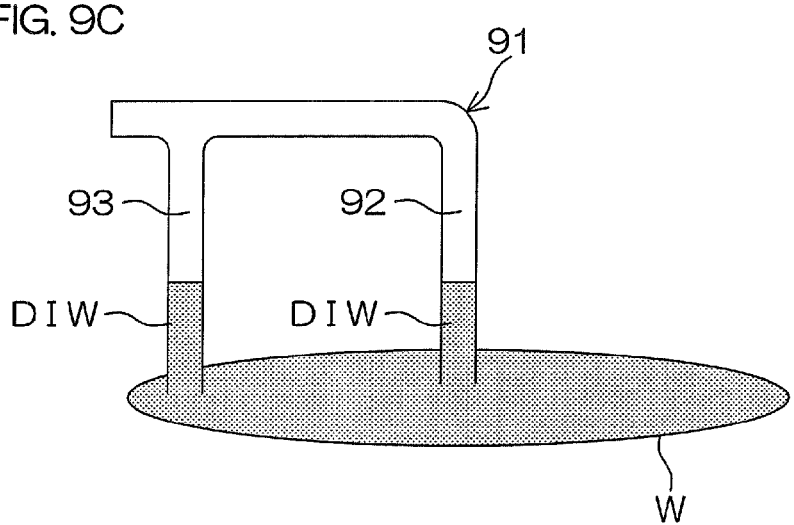
FIG. 9C is a diagram showing a fifth modification of the present invention.

The modification of FIG. 9B differs from the modification of FIG. 9A in that a rinse liquid nozzle 81 which is a scan nozzle adapted to spout the DIW as the rinse liquid is provided instead of the rinse liquid nozzle 5. In FIG. 9B, a nozzle 82 which is a scan nozzle adapted to spout the DIW is provided instead of the nozzle 71. The DIW is supplied to the rinse liquid nozzle 81 and the nozzle 82 from the DIW supply source.

Prior to the liquid puddling step (S422), the rinse liquid nozzle 81 is located with its spout directed toward around the rotation center of the substrate W. Further, the nozzle 82 is located with its spout directed to the peripheral portion of the substrate W. In the liquid puddling step (S422), the DIW is not only supplied to the center portion of the substrate W from the rinse liquid nozzle 81 but also supplied to the peripheral portion of the substrate W from the nozzle 82 as in the case of FIG. 9A.

The modification of FIG. 9C differs from the modification of FIG. 9A in that a rinse liquid nozzle 91 which is a scan nozzle having two spouts 92, 93 is provided instead of the rinse liquid nozzle 5. The spouts 92, 93 are each directed downward. The DIW is supplied to the rinse liquid nozzle 91 from the DIW supply source via a valve (not shown). With the valve open, the DIN is spouted downward from the spouts 92, 93.

Prior to the liquid puddling step (S422), the rinse liquid nozzle 91 is opposed to the front surface of the substrate W. In this state, the spout 92 is opposed to the center portion of the substrate W, and the spout 93 is opposed to the peripheral portion of the substrate W. In the liquid puddling step (S422), the DIW is not only spouted from the spout 92 to be supplied to the center portion of the substrate W, but also spouted from the spout 93 to be supplied to the peripheral portion of the substrate W.

Figure 10:
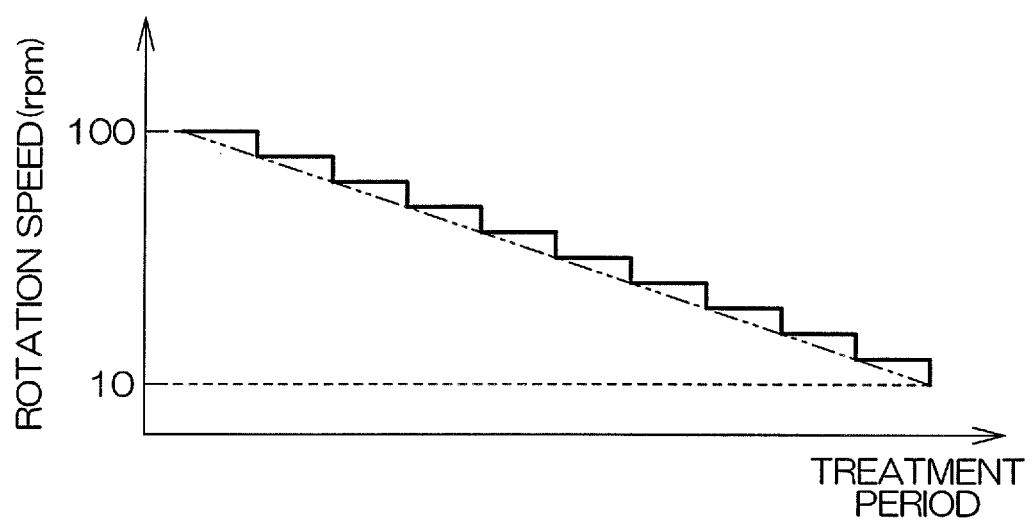
FIG. 10 is a diagram showing a sixth modification of the present invention.

In the embodiment described above, the rotation speed of the substrate W is gradually reduced at the predetermined lower deceleration rate in the liquid puddling step (S422). In the liquid puddling step (S422), the rotation speed of the substrate W may be reduced stepwise as shown in FIG. 10.

In the steep deceleration step (S421), the DIW is supplied to the substrate W at the same supply flow rate as in the higher-speed rinsing step. However, the rinse liquid supply flow rate in the steep deceleration step (S421) may be the same as that in the liquid puddling step (S422).

After the completion of the steep deceleration step (S421), the rotation speed of the substrate W is 100 rpm, but may be any rotation speed not higher than 200 rpm.

The DIW is used as the rinse liquid by way of example but not by way of limitation. Other examples of the rinse liquid include carbonated water, electrolytic ion water, ozone water, dilute hydrochloric acid solution (e.g., having a concentration of 10 to 100 ppm) and reduced water (hydrogen water).

Examples of the lower-surface-tension liquid other than the IPA liquid include organic solvents such as methanol, ethanol, acetone and HFE (hydrofluoroether).

The treatment to be performed by the substrate treatment apparatus 1 according to the present invention is not limited to the treatment to be performed after the rinsing step of the cleaning process for removing the silicon oxide film from the front surface of the substrate W, but may be a treatment to be performed after the rinsing steps of other various processes. However, the effects of the present invention are notable particularly where the front surface of the substrate W is hydrophobic. The treatment process which makes the front surface of the substrate W hydrophobic is not limited to the silicon oxide film removing process, but other example of the treatment process is a resist removing process.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application Nos. 2013-200424 and 2014-169334 filed in the Japan Patent Office on Sep. 26, 2013 and Aug. 22, 2014, respectively, the disclosures of which are incorporated herein by reference in their entirety.

What is claimed is:
1. A substrate treatment method comprising:
a chemical liquid step of supplying a chemical liquid to a rotation center of a front surface of a rotating substrate to treat the front surface of the substrate with the chemical liquid; and
a rinsing step of supplying a rinse liquid to the front surface of the rotating substrate after the chemical liquid step to rinse away the chemical liquid from the front surface of the substrate with the rinse liquid and form a liquid film of the rinse liquid;
wherein the rinsing step includes
a first rinsing step of supplying the rinse liquid to the rotation center of the front surface while rotating the substrate at a predetermined first rotation speed and form the liquid film of the rinse liquid to cover the entire front surface of the substrate with the liquid film so as to wash away the chemical liquid adhered to the front surface of the substrate, a first deceleration rinsing step of decelerating a rotation of the substrate from the first rotation speed to a second rotation speed lower than the first rotation speed at a predetermined deceleration rate while supplying the rinse liquid to the rotation center of the front surface of the substrate so as to keep the entire front surface of the substrate covered with the liquid film of the rinse liquid after the first rinsing step, and a second deceleration rinsing step of decelerating a rotation speed of the substrate from the second rotation speed to zero or to a third rotation speed of less than about 20 rpm at a deceleration rate that is lower than the predetermined deceleration rate in the first deceleration rinsing step, so as to form a liquid film covered over the entire front surface of the substrate after the first deceleration rinsing step, wherein the second deceleration rinsing step includes a step of supplying the rinse liquid to the front surface of the substrate at a supply flow rate higher than a maximum supply flow rate employed in the first rinsing step.

2. The substrate treatment method according to claim 1, wherein the supply flow rate of the rinse liquid is set to not lower than 4.0 (liters/min) in the second deceleration rinsing step.

3. The substrate treatment method according to claim 1, wherein the rotation speed of the substrate is reduced at a deceleration rate of not higher than 11.0 (rpm/sec) in the second deceleration rinsing step.

4. The substrate treatment method according to claim 1, wherein the first deceleration rinsing step is performed for not longer than 1.0 sec.

5. The substrate treatment method according to claim 1, wherein the rotation speed of the substrate is reduced to not higher than 200 rpm in the first deceleration rinsing step.

6. The substrate treatment method according to claim 1, wherein the supply flow rate of the rinse liquid to be supplied in the first deceleration rinsing step is 2.0 liters/min.

7. The substrate treatment method according to claim 1, wherein a supply flow rate of the rinse liquid to be supplied in the first deceleration rinsing step is set to the same flow rate as in the first rinsing step.

8. The substrate treatment method according to claim 1, wherein a supply flow rate of the rinse liquid to be supplied in the first deceleration rinsing step is set to the same flow rate as in the second deceleration rinsing step.

9. The substrate treatment method according to claim 1, further comprising a lower-surface-tension liquid replacing step of replacing the liquid film formed in the second deceleration rinsing step with a lower-surface-tension liquid.

* * * * *

UNITED STATES PATENT AND TRADEMARK OFFICE
CERTIFICATE OF CORRECTION

PATENT NO. : 9,548,197 B2  
APPLICATION NO. : 14/492692  
DATED : January 17, 2017  
INVENTOR(S) : Asuka Yoshizumi et al.

Page 1 of 1

It is certified that error appears in the above-identified patent and that said Letters Patent is hereby corrected as shown below:

In the Claims

Claim 1 at Column 15, Line 4, insert --speed-- before "of the substrate from the first rotation speed to a second".

Signed and Sealed this  
Eleventh Day of July, 2017

Joseph Matal  
*Performing the Functions and Duties of the*  
*Under Secretary of Commerce for Intellectual Property and*  
*Director of the United States Patent and Trademark Office*